United States Patent
Lee (10) Patent No.: US 7,688,144 B2
(45) Date of Patent: Mar. 30, 2010

(54) VARIABLE-GAIN WIDE-DYNAMIC-RANGE AMPLIFIER

(75) Inventor: Ching-Feng Lee, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 62 days.

(21) Appl. No.: 12/101,311

(22) Filed: Apr. 11, 2008

(65) Prior Publication Data

US 2009/0153245 A1 Jun. 18, 2009

(30) Foreign Application Priority Data

Dec. 14, 2007 (TW) ............... 96148033 A
Dec. 26, 2007 (CN) ............... 2007 1 0194392

(51) Int. Cl.
*H03F 3/45* (2006.01)

(52) U.S. Cl. ..................... 330/254
(58) Field of Classification Search ............. 330/51, 330/124 R, 254

See application file for complete search history.

(56) References Cited

U.S. PATENT DOCUMENTS 3,728,633 A 4/1973 Krebs
5,256,987 A * 10/1993 Kibayashi et al. ......... 330/295
6,049,251 A 4/2000 Meyer

* cited by examiner

*Primary Examiner*—Robert Pascal
*Assistant Examiner*—Khiem D Nguyen
(74) *Attorney, Agent, or Firm*—Thomas, Kayden, Horstemeyer & Risley (57) ABSTRACT

A variable-gain wide-dynamic-range amplifier including an amplifier module, a control unit, and an output current regulating circuit is provided. The amplifier module amplifies an input signal. The amplifier module includes several amplifier units coupled to each other in parallel. The gains of the amplifier units are different. The control unit enables at least one of the amplifier units according to a gain control signal. The at least one of the amplifier units which is enabled is for outputting a current signal in response to the input signal. The output regulating circuit is for receiving the current signal and outputting an output signal accordingly by regulating the magnitude of the current signal under the control of the control unit. Each of the amplifier units is coupled to the output current regulating circuit in series. The control unit is for controlling the output current regulating circuit according to the gain control signal.

12 Claims, 10 Drawing Sheets

FIG. 8C though # US 7,688,144 B2

VARIABLE-GAIN WIDE-DYNAMIC-RANGE AMPLIFIER

This application claims the benefit of Taiwan application Serial No. 96148033, filed Dec. 14, 2007, the subject matter of which is incorporated herein by reference.

BACKGROUND OF THE INVENTION

1. Field of the Invention

This invention relates in general to an amplifier, and more particularly to a variable-gain wide-dynamic-range amplifier.

2. Description of the Related Art

In the field of communication, a receiver, for receiving signal, ordinarily adopts variable gain amplifier to amplify the signal being received. When the magnitude of the received input signal varies, the gain of an amplifier will be regulated accordingly to maintain proper magnitude of the output signal.

Figure 1:
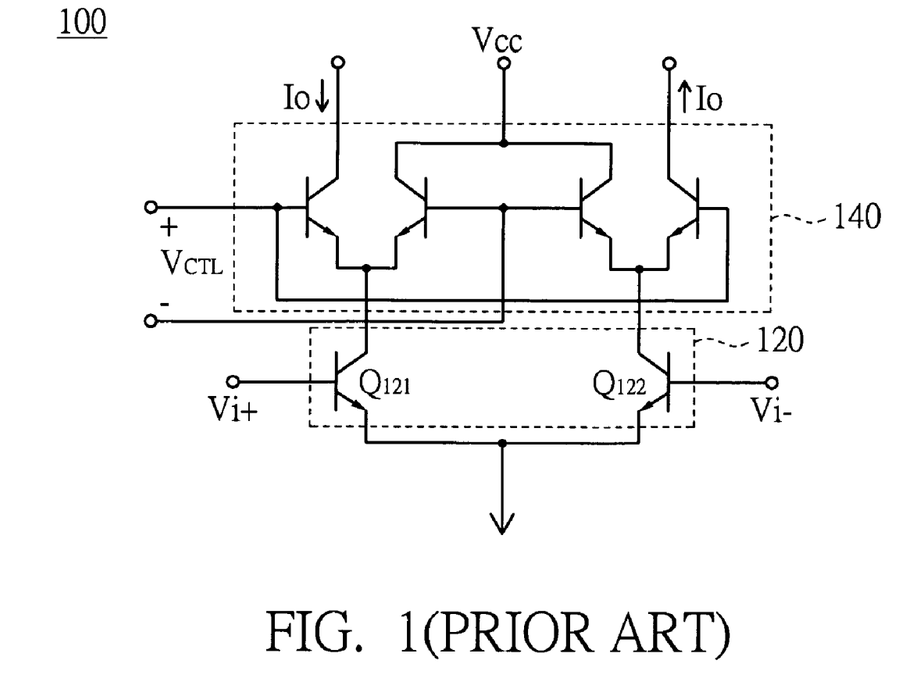
FIG. 1 (Prior Art) is a circuit diagram showing a conventional variable gain amplifier using a current steering circuit.

FIG. 1 is a circuit diagram showing a conventional variable gain amplifier using a current steering circuit. The variable gain amplifier 100 uses the current steering circuit 140 to regulate the gain of the amplifier 100 according to the voltage of the control signal $V_{CTL}$. When the magnitude of the input signal Vi increases, the voltage of the control signal $V_{CTL}$ is decreased to reduce the magnitude of the output current $I_o$ so as to reduce the gain of the amplifier 100. However, the transistors $Q_{121}$ and $Q_{122}$ of the differential amplifier 120 will be saturated as the magnitude of input signal Vi becomes too large, which cause the output signal distorted. In this situation, problem involved with the distorted waveform of output current $I_o$ still remains even with the manipulation of decreasing the magnitude of the output current $I_o$. It then comes to the acknowledgement of that the conventional variable gain amplifier 100 suffers the problem that the linearity is insufficient for meeting the generally requested needs. The mentioned linearity can be referred to as the range in which the magnitude of the input signal renders the output signal undistorted.

Figure 2:
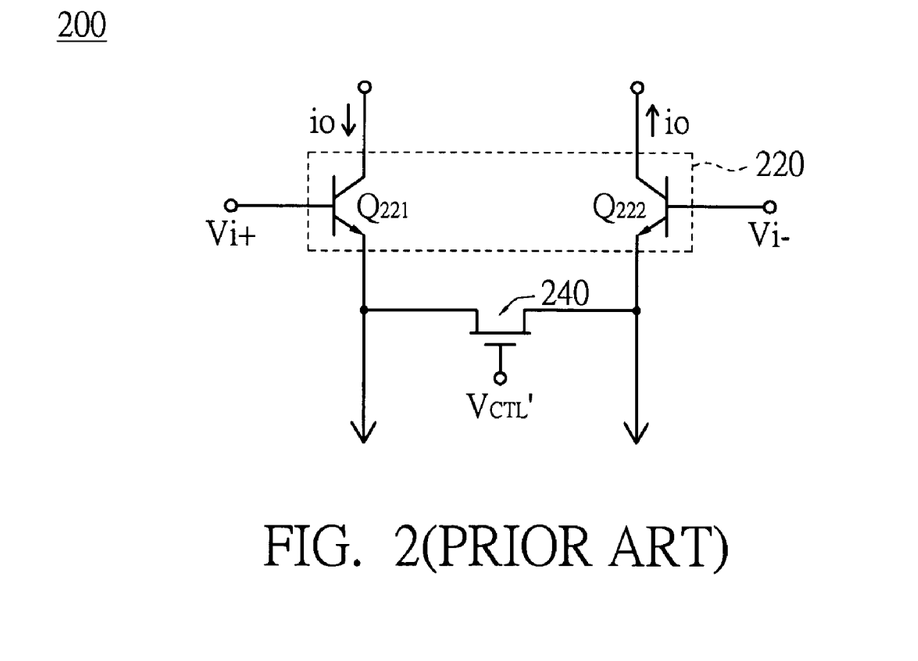
FIG. 2 (Prior Art) is a circuit diagram showing a conventional variable gain amplifier utilizing a degenerating resistance tuning circuit.

In order to increase the linearity, a conventional variable gain amplifier utilizing a degenerating resistance tuning circuit has been disclosed, as shown in FIG. 2. A metal oxide semiconductor field-effect transistor (MOSFET) serves as the degenerating resistance. The variable gain amplifier 200 controls the MOSFET 240 by adjusting the control voltage $V_{CTL}'$ to regulate the equivalent resistance of the amplifier 200, so as to regulate the gain of the amplifier 200. Therefore, the range in which the magnitude of input signal Vi can be amplified without distortion by the amplifier 200 can be extended. In this manner, the dynamic range of the variable gain amplifier 200 becomes larger and the linearity of the variable gain amplifier 200 is increased. It is noted that the gain of the variable gain amplifier 200 is associated with the resistance of the MOSFET 240. However, due to the fact that the higher the frequency, the greater the bad influence caused by the parasite capacities existing in the degenerating circuit, i.e. the MOSFET 240. Therefore, the gain of the variable gain amplifier 200 in high frequency can not be precisely regulated. Moreover, it is difficult to control the linearity of the variable gain amplifier 200.

Besides, the U.S. Pat. No. 3,728,633 has disclosed a radio receiver with wide dynamic range. The receiver system of the patent includes two receivers. The first receiver is controlled by an automatic gain control (AGC) bias and the second by a delayed AGC bias. When the signal input level increases, the level of the AGC bias is raised. When the AGC bias increases and reaches a cross-over point, the gain of the first receiver is reduced to essentially zero and the second receiver is begun to operate. In this receiver system, the two receivers are switched by employing the AGC bias and the delayed AGC bias, instead of employing switches physically.

The U.S. Pat. No. 5,625,321 has disclosed a variable gain amplifier apparatus. This gain amplifier apparatus uses two variable gain amplifiers having complementary relation in their gain ratio. The two variable gain amplifiers are controlled by the same gain control signal. When the gain of one variable gain amplifier is increased, the other decreased.

Figure 3A:
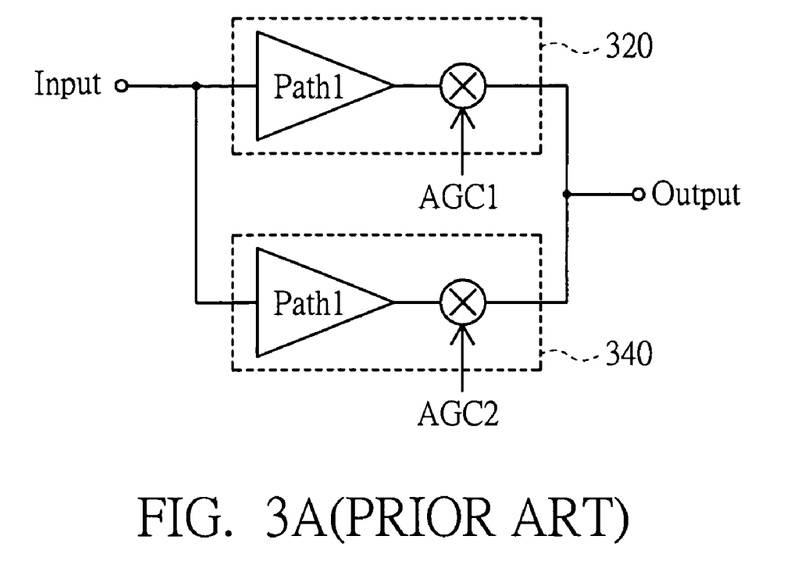
FIG. 3A (Prior Art) is a circuit diagram showing a conventional variable gain amplifier apparatus according to U.S. Pat. No. 6,049,251.
Figure 3B:
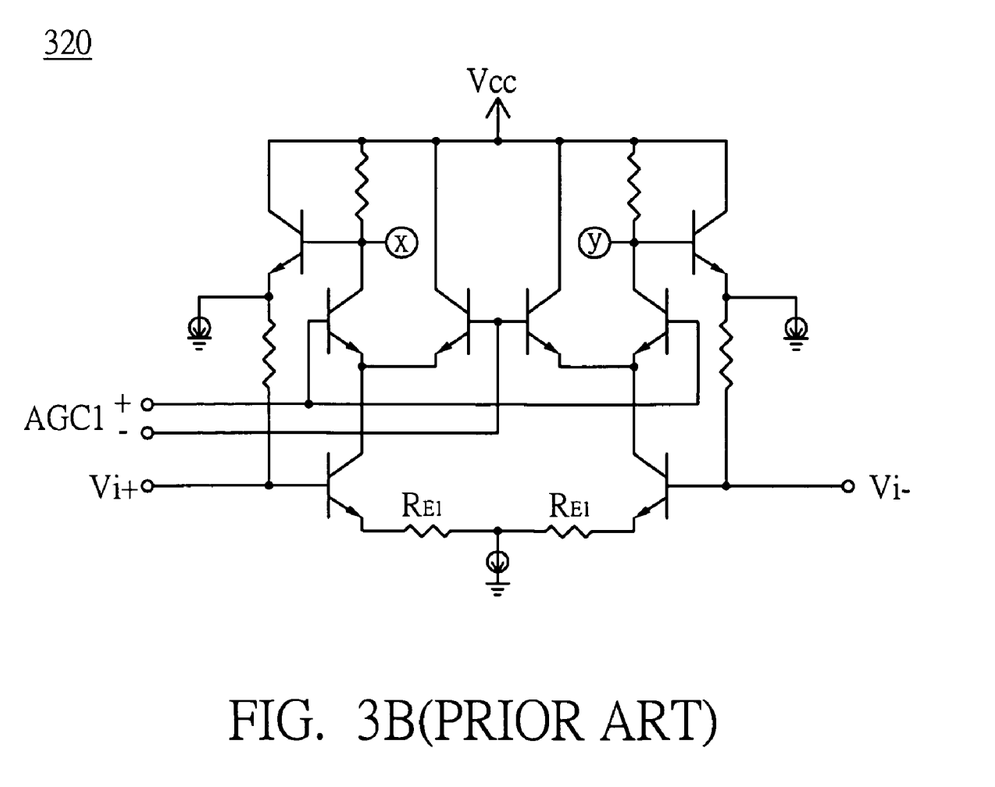
FIGS. 3B and 3C (Prior Art) are circuit diagrams showing the amplifier circuits 320 and 340 of FIG. 3A, respectively.
Figure 3C:
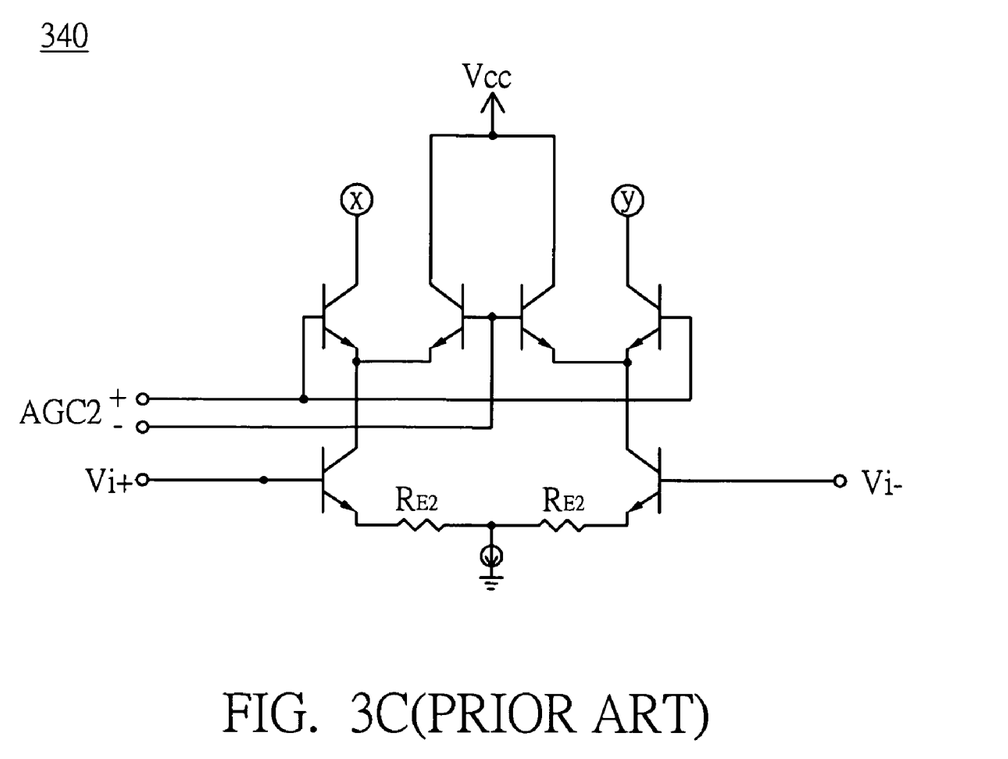

To solve the above-mention problem, that is, the difficulty in controlling the linearity of variable gain amplifier, the U.S. Pat. No. 6,049,251 also has disclosed a very-wide-range variable-gain amplifier as shown in FIG. 3A. This very-wide-range variable-gain amplifier includes two amplifier circuits 320 and 340. FIGS. 3B and 3C are circuit diagrams showing the amplifier circuits 320 and 340, respectively. The resistance of resistor $R_{E1}$ in FIG. 3B is smaller than that of resistor $R_{E2}$, so that the amplifier circuit 320 has higher gain than the amplifier circuit 340 and lower linearity than the amplifier circuit 340. The amplifier circuits 320 and 340 are coupled in parallel, and controlled by auto gain control signals AGC1 and AGC2, respectively. Due to the different gains of the amplifier circuits 320 and 340, it is possible to obtain two ranges of the magnitude of input signal Vi which can be amplified without distortion and thus achieve an amplifier with high linearity.

However, if the range for the allowable input signal is to be further extended, it is necessary to have at least one additional amplifier circuit coupled to each other in parallel. In this manner, it will increase the number of elements, the cost and the complexity of the whole circuit. Thus, it is an important subject to extend the range for the allowable magnitude of the input signal, while the circuit complexity thereof is not increased.

SUMMARY OF THE INVENTION

The invention is directed to a variable-gain wide-dynamic-range amplifier with higher dynamic range, less required elements and lower circuit complexity.

According to an aspect of the present invention, a variable-gain wide-dynamic-range amplifier is provided. The variable-gain wide-dynamic-range amplifier includes an amplifier module, a control unit, and an output current regulating circuit. The amplifier module is for amplifying an input signal. The amplifier module includes several amplifier units coupled to each other in parallel. The gains of the amplifier units are different. The control unit is for enabling at least one of the amplifier units according to a gain control signal. The at least one of the amplifier units, which is enabled, is for outputting a current signal in response to the input signal. The output regulating circuit receives the current signal. The output current regulating circuit is for outputting an output signal accordingly by regulating the magnitude of the current signal under the control of the control unit. Each of the amplifier units is coupled to the output current regulating circuit in series. The control unit is for controlling the output current regulating circuit according to the gain control signal.

The invention will become apparent from the following detailed description of the preferred but non-limiting embodiments. The following description is made with reference to the accompanying drawings.

DETAILED DESCRIPTION OF THE INVENTION

Figure 4:
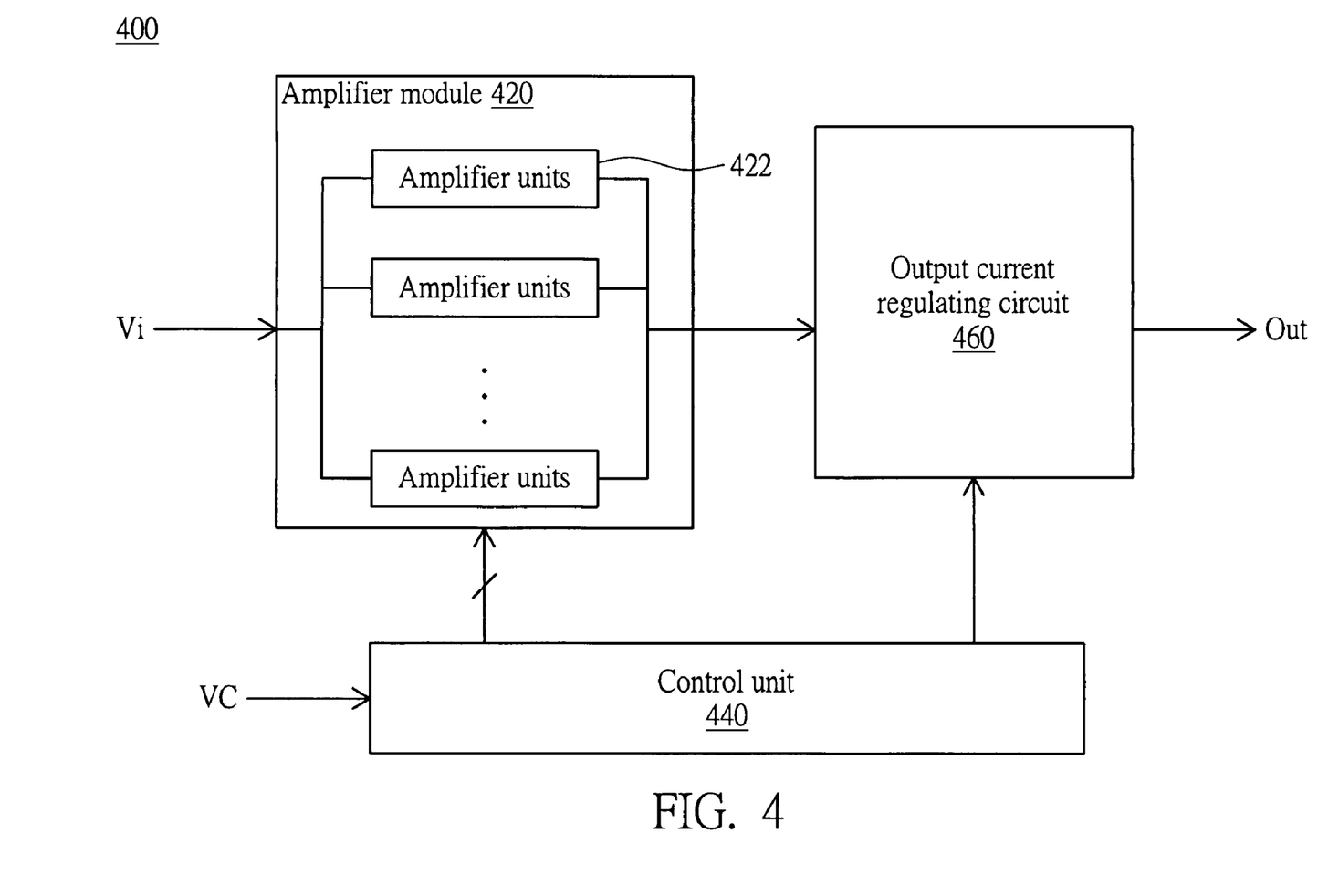
FIG. 4 is a block diagram showing the system of the variable-gain wide-dynamic-range amplifier according to an embodiment of the invention.

FIG. 4 is a block diagram showing the system of the variable-gain wide-dynamic-range amplifier according to an embodiment of the invention. The variable-gain wide-dynamic-range amplifier 400 in FIG. 4 includes an amplifier module 420, a control unit 440, and an output current regulating circuit 460. The amplifier module 420 amplifies an input signal Vi. The amplifier module 420 includes several amplifier units 422 which are coupled to each other in parallel. The gains of the amplifier units 422 are different. The control unit 440 enables at least one of the amplifier units 422 according to a gain control signal VC. The at least one of the amplifier units 422 which is enabled outputs a current signal Io in response to the input signal Vi. The output current regulating circuit 460 receives the current signal Io which is outputted from the at least one amplifier units which is enabled. The output current regulating circuit 460 regulates the magnitude of the current signal Io under the control of the control unit 440, so as to output an output signal Out accordingly. Each of the amplifier units 422 is coupled to the output current regulating circuit 460 in series. The control unit 440 controls the output current regulating circuit 460 according to the gain control signal VC.

In this embodiment, by using several amplifier units 422 coupled to each other in parallel, the control unit 440, which is controlled by the gain control signal VC, selects different amplifier units 422 to operate, so that the range for the magnitude of the input signal Vi, which renders the output signal undistorted, can be extended. That is, the dynamic range for the amplifier 400 can be extended. In addition, in the variable-gain wide-dynamic-range amplifier 400 illustrated in this embodiment of the invention, each of the amplifier units 422 thereof is coupled with the output current regulating circuit 460 in series. Therefore, the single output current regulating circuit 460 is capable of being shared by the amplifier units 422 so as to simplify the circuit effectively. Hence, in this embodiment, a wide dynamic range amplifier can be implemented while objects, such as to reduce the number of required elements, and to lower the cost by reducing the circuit complexity, can also be achieved. The output current regulating circuit 460 in this embodiment can be, for example, implemented by a current steering circuit. However, it is not limited thereto.

Figure 5:
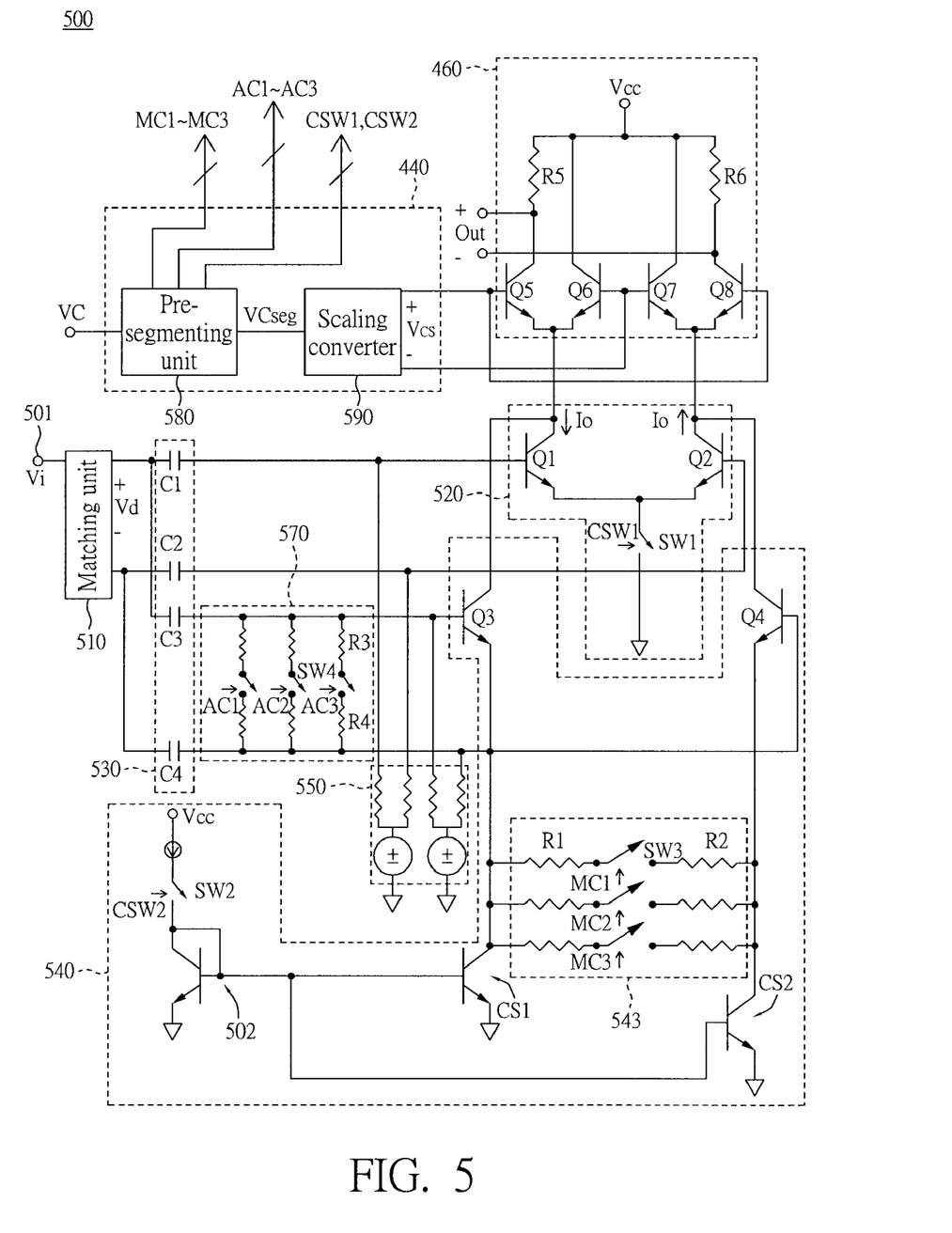
FIG. 5 is a detailed circuit diagram showing an example of the variable-gain wide-dynamic-range amplifier of FIG. 4.

FIG. 5 is a detailed circuit diagram showing an example of the variable-gain wide-dynamic-range amplifier in FIG. 4. The amplifier module 420 includes amplifier circuits 520, 540 and a selection unit. The amplifier circuit 520 includes a first differential amplifier for amplifying the input signal Vi. The amplifier circuit 540 includes a current source unit, a second differential amplifier and a resistor module 543. The second differential amplifier is coupled to the current unit and is for amplifying the input signal Vi. The resistor module 543 is coupled to the second differential amplifier and includes several main resistors R1, R2 and several main switches SW3. Each of the main switches SW3 is selectively turned on under the control of the control unit 440. The at least one of the main switches SW3 that is turned on causes the corresponding main resistors R1 and R2 to have a current path. The gain of the second differential amplifier is associated with the resistance of the at least one main resistor which has current path. The selection unit enables one of the first differential amplifier and the second differential amplifier under the control of the control unit 440, so that the enabled differential amplifier thereof outputs the current signal Io corresponding to the input signal Vi.

The variable-gain wide-dynamic-range amplifier 500 further includes an input end 501 and a matching unit 510. The input end 501 receives the input signal Vi. When the input signal Vi is not a differential signal, such as a radio frequency signal, the matching unit 510 converts the input signal Vi to a differential input signal Vd. The matching unit 510 also provides impedance matching for the circuits of next stage. The matching unit 510 can be, for example, implemented by a balance to unbalance transformer (BALUN). The differential input signal Vd herein is then processed by the first differential amplifier and the second differential amplifier.

The first differential amplifier of the amplifier circuit 520 has transistors Q1 and Q2. The bases of the transistors Q1 and Q2 receive the differential input signal Vd, and the emitters of the transistors Q1 and Q2 are coupled to the ground voltage. The current source unit of the amplifier circuit 540 includes current sources CS1 and CS2, which can be achieved by current mirror 502. The second differential amplifier includes transistors Q3 and Q4. The bases of the transistors Q3 and Q4 receive the differential input signal Vd, and the emitters of the transistors Q3 and Q4 are respectively coupled to the current sources CS1 and CS2. The emitter of transistor Q3 is further coupled to the main resistors R1, and the emitter of transistor Q4 to the main resistors R2. Each of the main resistors R1 is electrically connected to one of the main resistors R2 via one of the main switches SW3. The collectors of transistors Q1 and Q2 are respectively coupled to the collectors of the transistors Q3 and Q4 and are for outputting the current signal Io. The above-mentioned selection unit includes, for example, enabling switches SW1 and SW2. The switches SW1 is electrically connected to the emitters of transistors Q1 and Q2, and the switches SW2 is electrically connected to the current source 502. The emitters of the transistors Q1 and Q2 can be coupled to a current source alternatively, since the emitters of the transistors Q1 and Q2 are coupled to the ground for illustration in this embodiment.

The variable-gain wide-dynamic-range amplifier 500 further includes a direct current (DC) bias isolating circuit 530 and a bias circuit 550. The DC bias isolating circuit 530 is coupled between the input end 501 and the amplifier module 420. Preferably, the DC bias isolating circuit 530 is coupled between the matching unit 510 and the amplifier module 420. The bias circuit 550 provides DC bias to the amplifier module 420. The DC bias isolating circuit 530 includes, for example, four capacitors C1 to C4. One end of each of the capacitors is coupled to the input end 501 via the matching unit 510, while the other end of each of the capacitors is coupled to the bases of the transistors Q1 to Q4, respectively. The bias circuit 550 provides DC bias to the bases of the transistors Q1 to Q4. The capacitors C1 to C4 respectively isolate the DC voltages in the bases of the transistors Q1 and Q2 from the DC voltages in the bases of the transistors Q3 and Q4. The DC biases are directly provided to the transistors Q1 to Q4 by the bias circuit 550.

The operation of the variable-gain wide-dynamic-range amplifier 500 is described as follows. According to the gain control signal VC, the control unit 440 outputs switch control signals CSW1 and CSW2 to respectively control the enabling switches SW1 and SW2 to select one of the amplifier circuits 520 and 540. The gain control signal VC is provided by an external circuit and it is decreased accordingly when the input signal Vi increases. If the control unit 440 selects the amplifier circuit 540, the control unit 440 further outputs several enabling signal to control the main switches. In this embodiment, illustration is made according to the example, in which the resistor module 543 includes three main resistors R1 and three main resistors R2 with different resistances, and three main switches SW3. In the example, herein, the three main switches SW3 are controlled by several enabling signals MC1 to MC3 which the control unit 440 outputs. By turning on different switches, the resistor module 543 will have different equivalent resistances. For example, the equivalent resistance of the resistor module 543 when one of the three main switches SW3 is turned on will be different from that when two switches thereof concurrently are turned on. The amplifier circuit 540 with the resistor module 543 having different equivalent resistances can be equivalent to the amplifier units 422 having different gains in FIG. 4.

When the magnitude of the input signal Vi changes, the gain control signal VC varies correspondingly. When the magnitude of the input signal Vi increases, the gain control signal VC is then decreased, which causes the control unit 440 to select one of the amplifier units 422 with smaller gain. That is, if the magnitude of the input signal Vi is essentially the smallest, the control unit 440 will turn on the enabling switch SW1 and turn off the enabling switch SW2, so as to enable the amplifier circuit 520 and disable the amplifier circuit 540. Meanwhile, the gain of the amplifier module 420 is substantially equal to the gain of the amplifier circuit 520, while the gain of the amplifier module 420 is the highest and the linearity of the amplifier module 420 is lowest. When the magnitude of the input signal Vi gradually increases, the control unit 440 will then turn on the enabling switch SW1 and turn off the enabling switch SW2, so as to enable the amplifier circuit 540 and disable the amplifier circuit 520. Also, the control unit 440 turns on a portion of the main switches SW3 according to the gain control signal VC, so as to obtain the gain of the amplifier circuit 540 corresponding to the input signal Vi. Meanwhile, the gain of the amplifier module 420 is substantially equal to the gain of the amplifier circuit 540, while the gain of the amplifier module 420 increased and the linearity of the amplifier module 420 is decreased. Thus, when the magnitude of the input signal Vi is essentially the largest, the resistor module 543 is controlled to have the largest equivalent resistance, so that the amplifier circuit 540 has the lowest gain and the highest linearity. Consequently, the resistor module 543 can be accordingly designed corresponding to the range of the magnitude of the input signal Vi, in which the input signal Vi can be amplified with corresponding gain thereof and without distortion. The object to extend the dynamic range is thus achieved.

In addition, the DC bias isolating circuit 530 isolates the DC voltages in the bases of the transistors Q1 and Q2 from the DC voltages in the bases of the transistors Q3 and Q4. Hence, when the amplifier circuits 520 and 540 are optionally turned on and off by the selection unit, switching between the amplifier circuits 520 and 540 can be performed quickly. This is evidenced by that the capacitors C1 to C4 are unnecessary to be charged or discharged while the voltages of the bases of transistors Q1 to Q4 are respectively kept on an individual given voltages when switching the amplifier circuits 520 and 540. Therefore, the transition time for switching the amplifier circuits 520 and 540 can be reduced.

More specifically, the variable-gain wide-dynamic-range amplifier 500 can further comprises a resistance module 570. The transistor module 570 includes a number of auxiliary resistors R3 and R4, and a plurality of auxiliary switches SW4. The base of the transistor Q3 is further coupled to the auxiliary transistors R3 and the base of the transistor Q4 is further coupled to the auxiliary transistor R4. Each of the auxiliary resistors R3 is electrically connected to one of the auxiliary resistors R4 via one of the auxiliary switches SW4. The control unit 440 further outputs several enabling signal, such as AC1 to AC3, to control the auxiliary switches SW4 so as to cause the resistor module 570 to have different equivalent resistances. The gain of the amplifier 540 is not only associated with the resistance on the emitter side but also the resistance on the base side. With the resistor module 570, therefore, the amplifier circuit 540 could have more different gains. As a result, the gain of the amplifier circuit 540 can be finely regulated.

The amplifier circuits 520 and 540 share the output current regulating circuit 460 for reducing circuit elements and the cost. The output current regulating circuit 460 comprises transistors Q5 to Q8. The collectors of the transistors Q6 and Q7 are both electrically connected to a supply voltage Vcc. The collectors of the transistors Q5 and Q8 are both electrically connected to the supply voltage Vcc through resistors R5 and R6 respectively. The emitters of the transistors Q5 and Q6 are both electrically connected to the collector of the transistor Q1. The emitters of the transistors Q7 and Q8 are both coupled to the collector of the transistor Q2. The base of the transistor Q5 is electrically connected to the base of the transistor Q8. The base of the transistor Q6 is electrically connected to the base of the transistor Q7, and the voltages of the bases of the transistor Q5 and Q6 are controlled by the control unit 440. The collectors of the transistors Q5 and Q8 output the output signal Out.

The control unit 440 generates a current control signal Vcs according to the gain control signal VC to control the output current regulating circuit 460. The current, which flows through the transistor Q5 and Q8, is regulated by changing the magnitude of the voltage of the current control signal Vcs, so as to accordingly regulate the magnitude of the output current Out. The output signal Out can be taken as a voltage signal or a current signal. In this embodiment, the output signal Out of a voltage signal is taken as the example for illustration. That is, after the amplifier circuits 520 or 540 outputs the current signal Io to the current regulating circuit 460, a ratio R of the current flowing through the transistors Q5 and Q8 to the current signal Io will be decided by the magnitude of the voltage of current control signal Vcs, and thus the output signal Out will be generated according to the ratio R. As a result, the overall gain of the amplifier module 420 is equal to the gain of the amplifier circuits 520 or 540 multiplied by the ratio R.

More specifically, the control unit 440 includes a pre-segmenting unit 580 and a scaling converter 590. The pre-segmenting unit 580 receives the gain control signal VC, and outputs the enabling signals MC1 to MC3, AC1 to AC3 and CSW1 to CSW2, to respectively turn on at least one of the main switches SW3, at least one of the auxiliary switches SW4, and the enabling switches SW1 and SW2 according to the magnitude of the gain control signal VC. The pre-segmenting unit 580 further generates a segment control signal VCseg according to the gain control signal VC. The output current regulating circuit 460 regulates the magnitude of the current signal Io according to the segment control signal VCseg. The segment control signal VCseg is substantially of a sawtooth-like waveform relating to an axis of the input signal strength (such as dB value or absolute value) when the gain control signal VC increases or decreases with respect to the linear change in the strength (such as dB value or absolute value) of the input signal Vi. The scaling converter 590 regulates the magnitude of the segment control signal VCseg to generate the current control signal Vcs. The output current regulating circuit 460 regulates the magnitude of the current signal Io according to the current control signal Vcs which is generated from the regulated segment control signal VCseg.

The magnitude of the current flowing through the transistors Q5 to Q8 has an exponential relationship with the voltages between the bases and the emitters thereof. So, it is preferred that the scaling converter 590 converts the segment control signal VCseg, which varies linearly with respect to the strength (such as dB value or absolute value) of the input signal Vi, to the current control signal Vcs capable of regulating the magnitude of the current flowing through the transistors Q5 to Q8 in a linear manner.

Figure 6:
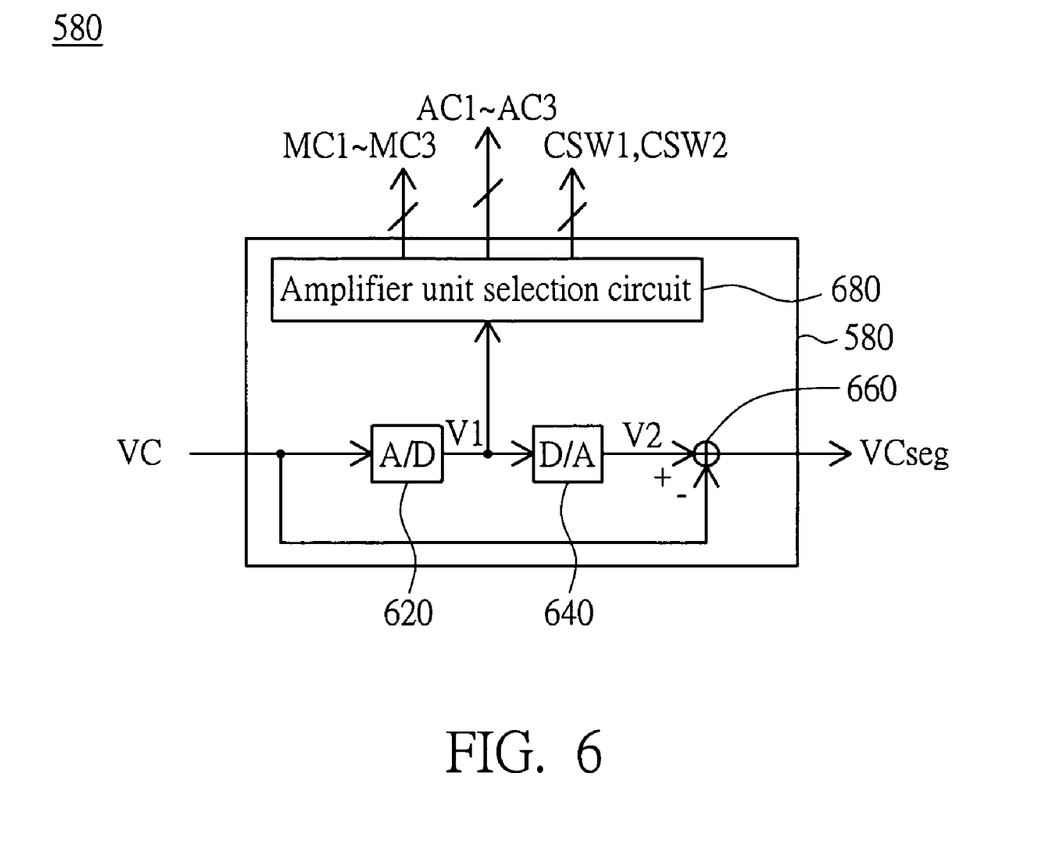
FIG. 6 is a circuit diagram showing an example of the pre-segmenting unit in FIG. 5.

FIG. 6 is a circuit diagram showing an example of the pre-segmenting unit 580 in FIG. 5. The pre-segmenting unit 580 comprises an analog to digital converter (ADC) 620, a digital to analog converter (DAC) 640 and a subtractor 660. The ADC 620 converts the gain control signal Vc to a signal V1, the DAC 640 converts the signal V1 to a signal V2, and the subtractor 660 generates the segment control signal VCseg by subtracting the gain control signal Vc from the signal V2.

Referring to FIG. 6, the pre-segmenting unit 580 may further include an amplifier unit selection circuit 680. The amplifier unit selection circuit 680 accordingly outputs the enabling signals MC1 to MC3, AC1 to AC3 and CSW1 to CSW3, to respectively turn on at least one of the main switches SW3, at least one of the auxiliary switches SW4, and the enabling switches SW1 and SW2 according to the magnitude of the gain control signal VC.

Figure 7A:
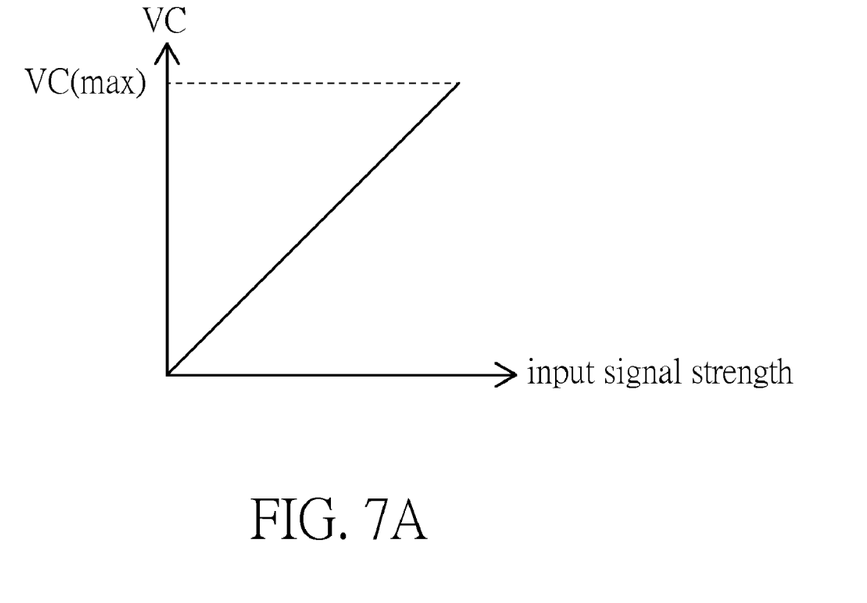
FIGS. 7A to 7D are waveform diagrams showing an example of the gain control signal VC for the pre-segmenting unit and the segment control signal VCseg of FIG. 6.
Figure 7B:
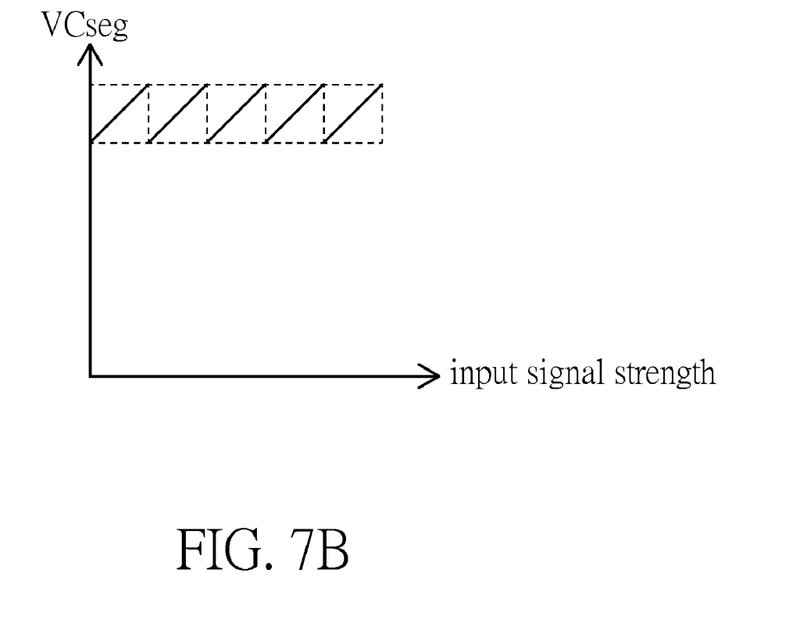
Figure 7C:
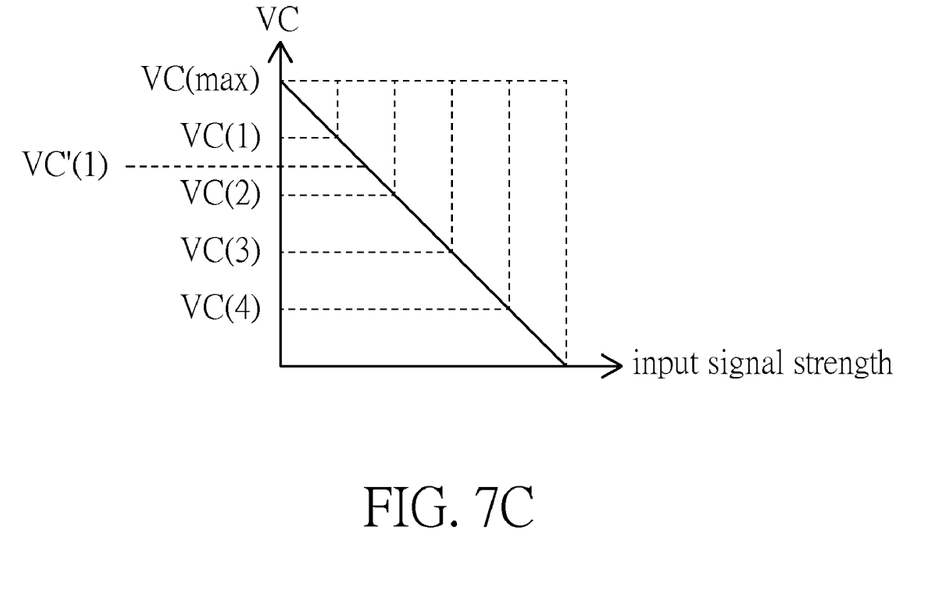
Figure 7D:
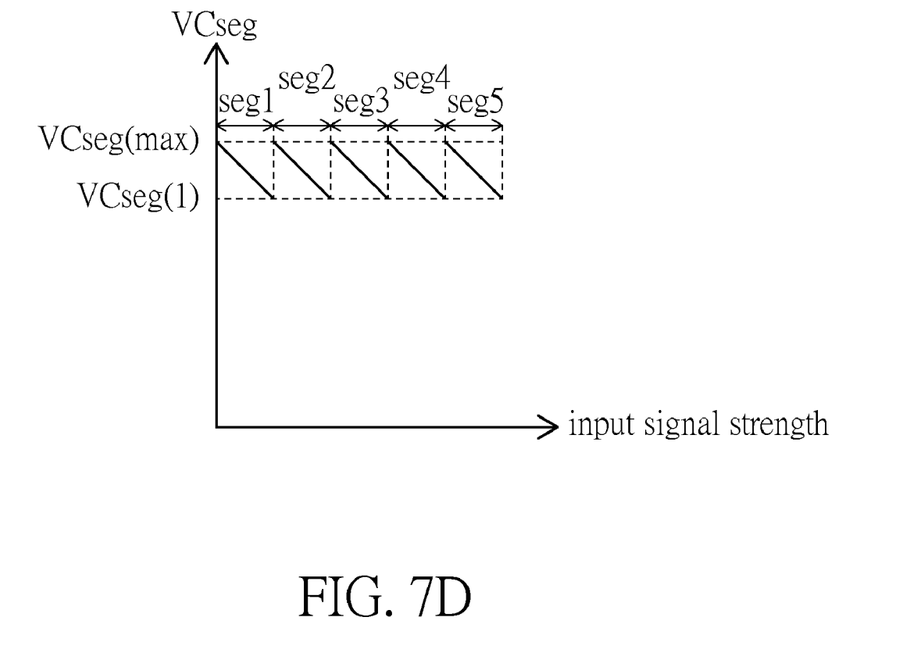

FIGS. 7A to 7D are waveform diagrams showing an example of the gain control signal VC of pre-segmenting unit 580 and the segment control signal VCseg in FIG. 6. Referring to FIGS. 7A and 7C, when the gain control signal VC increases or decreases with respect to the linear change in the strength (such dB value or absolute value) of the input signal Vi, the segment control signal VCseg is substantially of a sawtooth-like waveform relating to the axis of the input signal strength (such dB value or absolute value), which are shown in FIGS. 7B and 7D, respectively. Illustration will be made according to the example, in which the segment control signal VCseg is divided into five segments. In this example, herein, these five segments indicate that, there are five different gains for the amplifier units 422 which can be controlled by the segment control signal VCseg. The five segments Seg1 to Seg5 shown in FIG. 7D will be provided for illustration.

Referring to FIG. 7D, when the voltage of the gain control signal VC decreases from its maximum VC(max), one of the amplifier units 422 corresponding to the segment Seg1 will be selected, and the magnitude of the segment control signal VCseg will be decreased from VCseg(max), so that the ratio R of the current flowing through the transistors Q5 and Q8 to the output current Io is decreased from its maximum. When the voltage of the gain control signal VC decreases to VC(1), one of the amplifier units 422 corresponding to the segment Seg2 will be selected, and the magnitude of the segment control signal VCseg will still be reduced from VCseg(max), so that the ratio R of the current flowing through the transistors Q5 and Q8 to the output current Io is still decreased from its maximum. Analogically, the operations in segments Seg3 to Seg5 are taken in a similar way. The above-mentioned operations have the following advantages. When the variation in the magnitude of the gain control signal VC leads to the amplifier units 422 with a different gain to be selected, the ration R corresponding to the output current regulating circuit 460 is always decreased from its maximum value. As a result, in each of the segments, the overall gain of the variable-gain wide-dynamic-range amplifier 500, which includes the output current regulating circuit 460 and the amplifier module 420, can also be initially operated with its maximum gain value, and then its gain decreases from the maximum gain value. Therefore, the changeable range for the overall gain of the variable-gain wide-dynamic-range amplifier 500 can be extended, and the efficiency of the amplifier 500 as a whole can thus be enhanced.

Figure 8A:
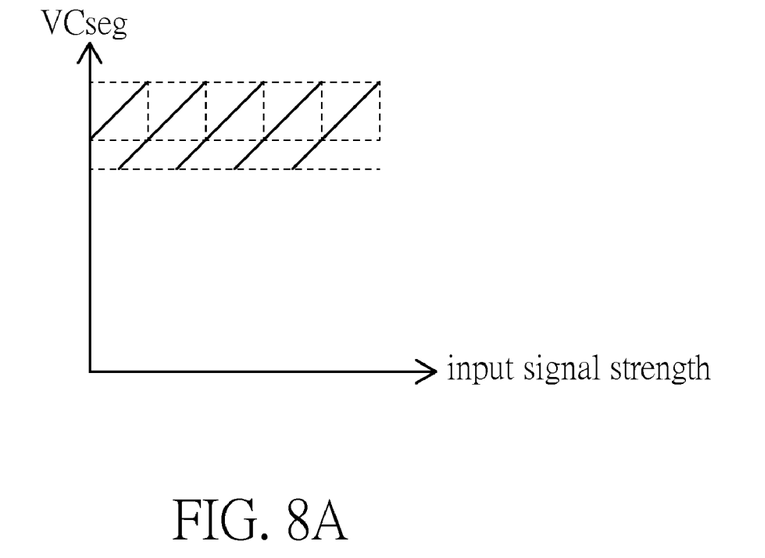
FIGS. 8A and 8B show the gain control signal VC designed as segment control signal VCseg being a waveform of sawtooth-like waveform with hysteresis in FIGS. 7A and 7C, respectively.
Figure 8B:
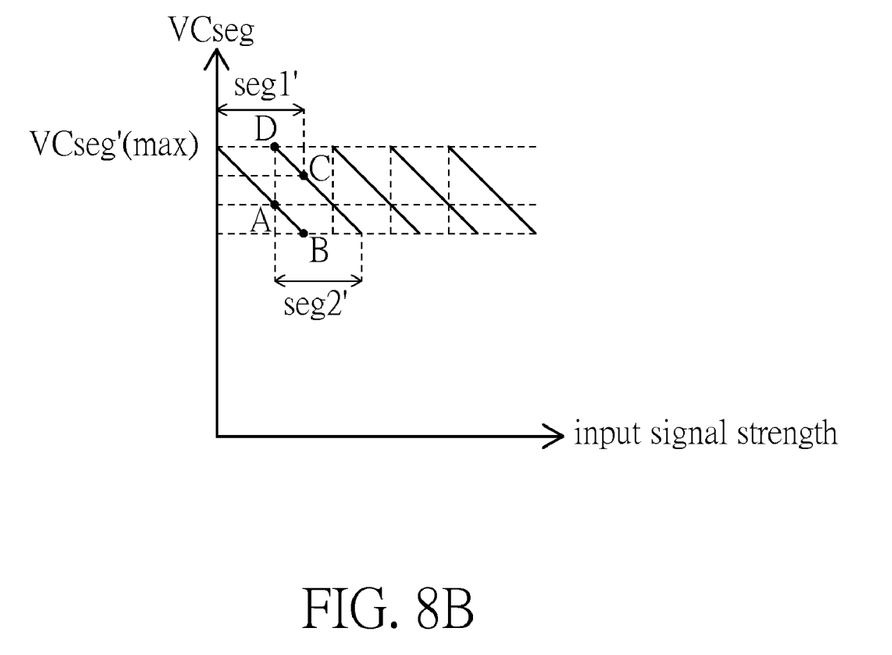

In addition, in order to improve the ability for noise tolerance as well as to prevent the amplifier units 422 from being switched too excessively, the segment control signal VCseg, corresponding to the gain control signal VC shown in FIGS. 7A and 7C, can be designed as to have a waveform of the sawtooth-like waveform with hysteresis as shown in FIGS. 8A and 8B. Referring to FIGS. 7C and 8B, the hysteresis, illustrated herein, indicates that each two of the neighboring segments is partly overlapped to each other. To be articulate for the effect of hysteresis, it is assumed that the amplifier units 422 corresponding to the segment Seg1' is currently selected. The voltage of the gain control signal VC decreases with respect to the increasing strength of the input signal Vi. When the voltage of the gain control signal VC continuously decreases to VC(1), where the level of the segment control signal VCseg corresponds to the point A in FIG. 8B, the control unit 440 yet will not lead to the amplifier units 422 with a different gain to be selected. When the of the gain control signal VC decreases to VC'(1), where the level of the segment control signal VCseg corresponds to the point B in FIG. 8B, the amplifier units 422 corresponding to the segment Seg2' will then be selected and the level of the segment control signal VCseg will correspond to the point C in FIG. 8B. Analogically, the reverse operation is performed in a similar way as follows. It is assumed that the amplifier units 422 corresponding to the segment Seg2' is currently selected. The voltage of the gain control signal VC increases with respect to the decreasing strength of the input signal Vi. When the voltage of the gain control signal VC continuously increases to VC'(1), where the level of the segment control signal VCseg corresponds to the point C in FIG. 8B, the control unit 440 yet will not lead to the unit 422 with a different gain to be selected. When the voltage of the gain control signal VC increases to VC(1), where the level of the segment control signal VCseg corresponds to the point D in FIG. 8B, the amplifier units 422 corresponding to the segment Seg1' will then be selected and the level of the segment control signal VCseg will correspond to the point A in 8B. As a result, in the two segments Seg1' and Seg2' which are partly overlapped to each other, the operation in points A to D for the variable-gain wide-dynamic-range amplifier can be regarded as a protective operation with hysteresis effect.

In another aspect, in order to improve the ability for noise tolerance as well as to prevent the amplifier module 420 from being switched unstably between two adjacent amplifier units (the switch between two adjacent amplifier units exemplarily mean that the amplifier module 420 switches from one amplifier unit whose highest gain is higher to another amplifier unit whose highest gain is lower, or switches from one amplifier unit whose highest gain is lower to another amplifier unit whose highest gain is higher), we may design to make the lowest gain of one amplifier unit, whose highest gain is higher and when corresponding segment control signal VCseg is adjusted to the lowest level, be lower than the highest gain of the other amplifier, whose highest gain is lower when the corresponding segment control signal VCseg is adjusted to the highest level.

Figure 8C:
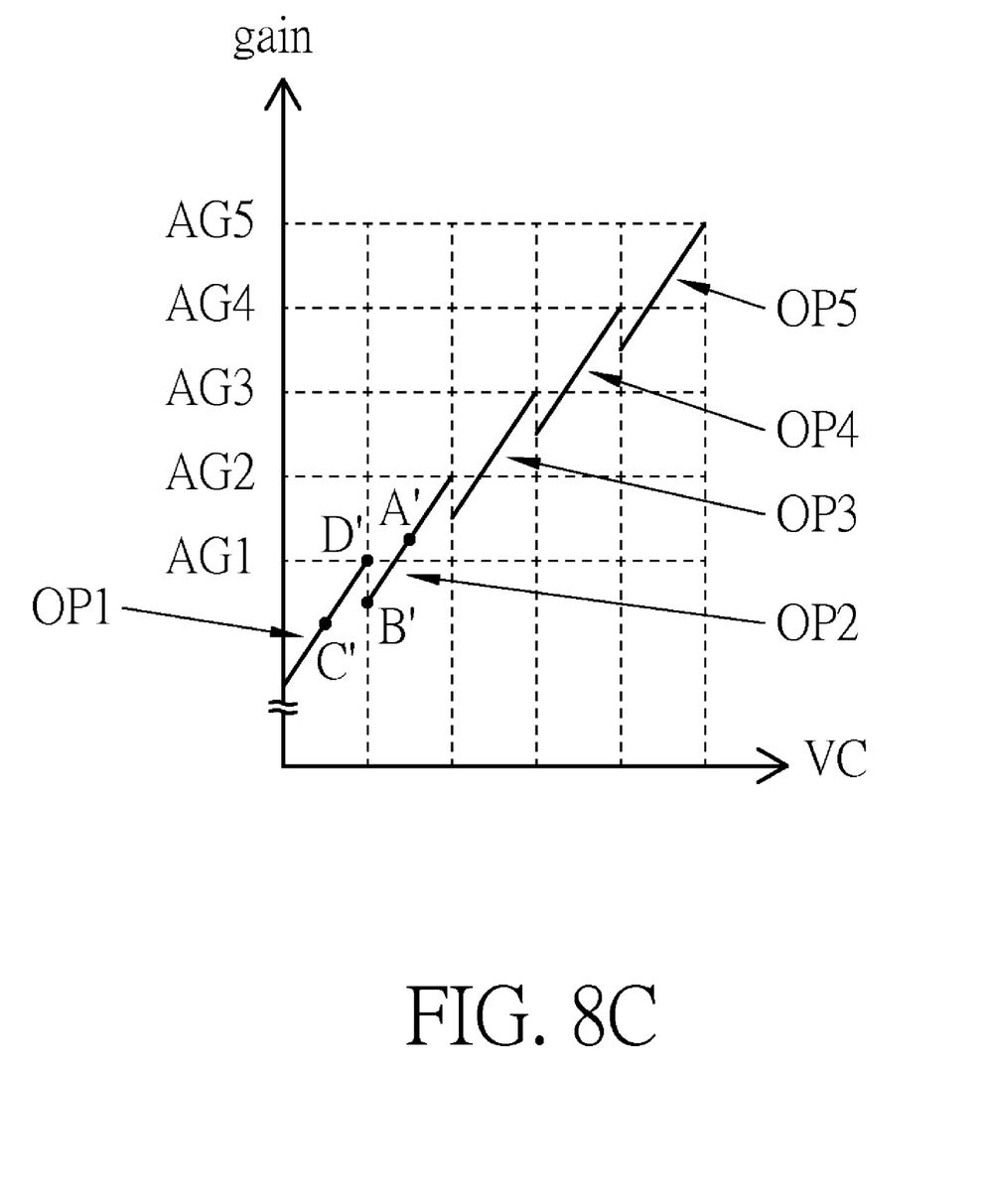
FIG. 8C shows an example of gain variation wherein the highest gain level of each amplifier units is designed, and the level of the gain control signal VC in FIG. 7C as well as the level of the segment control signal VCseg in FIG. 7D are adjusted, so that the variable-gain wide-dynamic-range amplifier of this embodiment can be protectively operated with hysteresis effect.

For example, referring to FIG. 8C which shows an example of gain variation wherein the highest gain level of each amplifier units is designed, and the level of the gain control signal VC in FIG. 7C as well as the level of the segment control signal VCseg in FIG. 7D are adjusted, so that the variable-gain wide-dynamic-range amplifier of this embodiment can be protectively operated with hysteresis effect. In the example shown in FIG. 8C, the amplifier module 420 at least has five amplifier units corresponding to the arrows OP1~OP5 and having their highest gains being designed to have levels AG1~AG5, respectively. It is assumed that the amplifier module 420 switches from the amplifier unit corresponding to arrow OP2 to another amplifier unit corresponding to arrow OP1. It can be seen from FIG. 8C that the amplifier unit corresponding to arrow OP2 has its highest gain higher than the highest gain of the amplifier unit corresponding to arrow OP1, i.e. the level AG2 is higher than the level AG1. Moreover, the amplifier unit corresponding to arrow OP2 has its lowest gain, which corresponds to point B, lower than the highest gain of the amplifier unit corresponding to arrow OP1, which corresponds to point D'. Correspondingly, the amplifier units corresponding to the arrows OP1 to OP5 have similar relationship in their gain levels.

For another example, it is assumed herein that the overall gain of the variable-gain wide-dynamic-range amplifier starts form the lowest gain of the amplifier unit corresponding to arrow OP2 (i.e. the point B' in FIG. 8C). When the input signal strength is disturbed and increases slightly, an external automatic gain control circuit (not shown) will decrease the gain control signal VC slightly, so as to enable the amplifier module 420 to switch to the amplifier unit corresponding to arrow OP1. At this time, the overall gain of the variable-gain wide-dynamic-range amplifier will become the one slightly lower than the lowest gain of the amplifier unit corresponding to arrow OP2 (such as the gain level corresponding to point C' in FIG. 8C). At this time, even that the input signal strength is disturbed and decreased slightly and cause the automatic gain control circuit increase the gain control signal VC slightly, the amplifier module 420 will not switch from the amplifier unit corresponding to arrow OP1 to the amplifier unit corresponding to arrow OP2, and a protective operation with hysteresis effect can thus be achieved.

Analogically, it is assumed herein that the overall gain of the variable-gain wide-dynamic-range amplifier starts from the highest gain of the amplifier unit corresponding to arrow OP1 (i.e. the point D' in FIG. 8C). When the input signal strength is disturbed and decreases slightly, the external automatic gain control circuit will increase the gain control signal VC slightly, so as to enable the amplifier module 420 to switch to the amplifier unit corresponding to arrow OP2. At this time, the overall gain of the variable-gain wide-dynamic-range amplifier will become the one slightly higher than the highest gain of the amplifier unit corresponding to arrow OP1 (such as the gain level corresponding to point A' in FIG. 8C). At this time, even that the input signal strength is disturbed and increased slightly and cause the automatic gain control circuit decrease the gain control signal VC slightly, the amplifier module 420 will not switch from the amplifier unit corresponding to arrow OP2 to the amplifier unit corresponding to arrow OP1, and a protective operation with hysteresis effect can thus be achieved.

Therefore, as we can see from FIG. 8C, the operation in points A' to D' for the variable-gain wide-dynamic-range amplifier can be regarded as a protective operation with hysteresis effect. As a result, this embodiment can protectively operate with hysteresis effect, and can prevent the amplifier module 420 from being switched unstably between two adjacent amplifier units.

The variable-gain wide-dynamic-range amplifier according to the embodiment of the invention has the following features. The dynamic range for the amplifier can be extended by using several amplifier units with different gains coupled to each other in parallel, and the circuit complexity can be simplified by sharing a current regulating circuit. Furthermore, different amplifier circuits can be switched quickly by using a DC bias isolating circuit.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A variable-gain wide-dynamic-range amplifier, comprising:
   an amplifier module for amplifying an input signal, the amplifier module comprising a plurality of amplifier units coupled to each other in parallel, the gains of the amplifier units being different;
   a control unit for enabling at least one of the amplifier units according to a gain control signal, the at least one of the amplifier units which is enabled being for outputting a current signal in response to the input signal; and
   an output current regulating circuit for receiving the current signal which is outputted from the at least one of the amplifier units which is enabled, and regulating the magnitude of the current signal to output an output signal accordingly under the control of the control unit, each of the amplifier units being coupled to the output current regulating circuit in series;
   wherein the control unit is for controlling the output current regulating circuit according to the gain control signal;
   wherein the gain control signal corresponds to the magnitude of the input signal, and the control unit comprises:
   a pre-segmenting unit for receiving the gain control signal, and outputting a plurality of enabling signal accordingly to respectively enable the amplifier units according to the magnitude of the gain control signal, and further for generating a segment control signal according to the gain control signal, the output current regulating circuit regulating the magnitude of the current signal according to the segment control signal, wherein the segment control signal is substantially of a sawtooth-like waveform relating to an axis of the input signal strength when the gain control signal increases or decreases with respect to the linear change in the strength of the input signal.

2. The variable-gain wide-dynamic-range amplifier according to claim 1, wherein the sawtooth-like waveform is a waveform of sawtooth-like waveform with hysteresis.

3. The variable-gain wide-dynamic-range amplifier according to claim 1, wherein the pre-segmenting unit comprises:
an analog to digital converter for converting the gain control signal to a first signal;
a digital to analog converter for converting the first signal to a second signal; and
a subtractor for generating the segment control signal by subtracting the gain control signal from the second signal.

4. A variable-gain wide-dynamic-range amplifier, comprising:
an amplifier module for amplifying an input signal, the amplifier module comprising a plurality of amplifier units coupled to each other in parallel, the gains of the amplifier units being different;
a control unit for enabling at least one of the amplifier units according to a gain control signal, the at least one of the amplifier units which is enabled being for outputting a current signal in response to the input signal; and
an output current regulating circuit for receiving the current signal which is outputted from the at least one of the amplifier units which is enabled, and regulating the magnitude of the current signal to output an output signal accordingly under the control of the control unit, each of the amplifier units being coupled to the output current regulating circuit in series;
wherein the control unit is for controlling the output current regulating circuit according to the gain control signal;
wherein the control unit further comprises a scaling converter for regulating the magnitude of a segment control signal, and the output current regulating circuit regulates the magnitude of the current signal according to the regulated segment control signal.

5. A variable-gain wide-dynamic-range amplifier, comprising:
an amplifier module for amplifying an input signal, the amplifier module comprising a plurality of amplifier units coupled to each other in parallel, the gains of the amplifier units being different;
a control unit for enabling at least one of the amplifier units according to a gain control signal, the at least one of the amplifier units which is enabled being for outputting a current signal in response to the input signal; and
an output current regulating circuit for receiving the current signal which is outputted from the at least one of the amplifier units which is enabled, and regulating the magnitude of the current signal to output an output signal accordingly under the control of the control unit, each of the amplifier units being coupled to the output current regulating circuit in series;
wherein the control unit is for controlling the output current regulating circuit according to the gain control signal;
wherein the amplifier module comprises:
a first amplifier circuit comprising a first differential amplifier for amplifying the input signal;
a second amplifier circuit comprising:
a current source unit;
a second differential amplifier for amplifying the input signal, the second differential amplifier being coupled to the current unit; and
a first resistor module coupled to the second differential amplifier, the first resistor module comprising a plurality of main resistors and a plurality of main switches, each of the main switches being selectively turned on under the control of the control unit, at least one of the main switches that is turned on causing at least one of the main resistor to have a current path, the gain of the second differential amplifier being associated with the resistance of the at least one main resistor which has current path; and
a selection unit for enabling one of the first differential amplifier and the second differential amplifier under the control of the control unit, so that the enabled one of the first differential amplifier and the second differential amplifier outputs the current signal corresponding to the input signal.

6. The variable-gain wide-dynamic-range amplifier according to claim 5, wherein the first differential amplifier has a first transistor and a second transistor, the bases of the first transistor and the second transistor are for receiving the input signal, and the emitters of the first transistor and the second transistor are coupled to the ground;
wherein the current source unit comprises a first current source and a second current source, the second differential amplifier comprises a third transistor and a fourth transistor, the main resistors comprise a plurality of first main resistors and a plurality of second main resistors, the third transistor and the fourth transistor are respectively coupled to the first current source and the second current source, the emitter of the third transistor is further coupled to the first main resistors, the emitter of the fourth transistor is further coupled to the second main resistors, and each of the first main resistors is electrically connected to one of the second main resistors via one of the main switches;
wherein the collectors of the first transistor and the second transistor are respectively coupled to the collectors of the third transistor and the fourth transistor for outputting the current signal.

7. The variable-gain wide-dynamic-range amplifier according to claim 6, further comprising an input end for receiving the input signal, a direct current (DC) bias isolating circuit coupled between the input end and the amplifier module, and a bias circuit for providing DC bias to the amplifier module.

8. The variable-gain wide-dynamic-range amplifier according to claim 7, wherein the DC bias isolating circuit comprises four capacitors, one end of the four capacitors is coupled to the input port, the other end of the capacitors is respectively coupled to the bases of the first transistor, the second transistor, the third transistor and the fourth transistor, and the bias circuit provides DC bias to the bases of the first to fourth transistors.

9. The variable-gain wide-dynamic-range amplifier according to claim 6, wherein the amplifier module further comprises a second transistor module, the second transistor module comprises a plurality of first auxiliary resistors, a plurality of second auxiliary resistors and a plurality of auxiliary switches, the base of the third transistor is further coupled to the first auxiliary transistors, the base of the fourth transistor is further coupled to the second auxiliary transistor, and each of the first auxiliary resistors is electrically connected to one of the second auxiliary resistors via one of the auxiliary switches.

10. The variable-gain wide-dynamic-range amplifier according to claim 6, wherein the output current regulating circuit comprises a fifth transistor, a sixth transistor, a seventh transistor and a eighth transistor, the collectors of the sixth transistor and the seventh transistor are electrically connected to a supply voltage, the emitters of the fifth transistor and the sixth transistor are both electrically connected to the collector of the first transistor, the emitters of the seventh transistor and the eighth transistor are both coupled to the collector of the second transistor, the base of the fifth transistor is electrically connected to the base of the eighth transistor, the base of the sixth transistor is electrically connected to the base of the seventh transistor, and the voltages of the bases of the fifth transistor and the sixth transistor are controlled by the control unit;

wherein the collectors of the fifth transistor and the eighth transistor are for outputting the output signal.

11. The variable-gain wide-dynamic-range amplifier according to claim 5, further comprising a matching unit for converting the input signal into a differential input signal that is a differential signal when the input signal is not a differential signal, the first differential amplifier and the second differential amplifier amplifying the differential input signal.

12. The variable-gain wide-dynamic-range amplifier according to claim 1, wherein in the two adjacent amplifier units, one of the two adjacent amplifier units whose highest gain is higher than the highest gain of the other of the two adjacent amplifier units is defined as a first amplifier unit, and the other of the two adjacent amplifier units is defined as a second amplifier unit, the gain of the first and second amplifier units are variable, the lowest gain of the first amplifier unit is lower than the highest gain of the second amplifier unit.

* * * * *